(12) United States Patent
Kinnard et al.

(10) Patent No.: US 6,259,072 B1
(45) Date of Patent: Jul. 10, 2001

(54) ZONE CONTROLLED RADIANT HEATING SYSTEM UTILIZING FOCUSED REFLECTOR

(75) Inventors: David W. Kinnard, Olney; Andre G. Cardoso, Laurel, both of MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/436,681

(22) Filed: Nov. 9, 1999

(51) Int. Cl.$^7$ ....................................... H05B 1/02
(52) U.S. Cl. ................... 219/486; 219/483; 219/506; 219/497; 392/416; 118/725
(58) Field of Search ..................... 219/121.4, 121.43, 219/121.44, 497, 506, 483, 486; 392/416–420; 118/724, 725

(56) References Cited

U.S. PATENT DOCUMENTS

| | | | |
|---|---|---|---|
| 4,981,815 | 1/1991 | Kakoschke | 437/173 |
| 5,155,336 | * 10/1992 | Gronet et al. | 219/411 |
| 5,179,677 | 1/1993 | Anderson et al. | 392/416 |
| 5,268,989 | 12/1993 | Moslehi et al. | 392/418 |
| 5,418,885 | * 5/1995 | Hauser et al. | 392/416 |
| 5,446,825 | 8/1995 | Moslehi et al. | 392/416 |
| 5,551,985 | * 9/1996 | Brors et al. | 118/725 |
| 5,561,612 | * 10/1996 | Thakur | 364/557 |
| 5,937,142 | * 8/1999 | Moslehi et al. | 392/416 |
| 6,122,440 | * 9/2000 | Campbell | 392/420 |

* cited by examiner

Primary Examiner—Mark Paschall
(74) Attorney, Agent, or Firm—John A. Kastelic

(57) ABSTRACT

A temperature control system (20, 22, 24) is provided for a plasma processing device (10). The plasma processing device (10) comprises a plasma generator (14) and a processing chamber (52) in communication with the plasma generator (14) such that plasma within the generator may pass into the chamber and react with the surface of a substrate (18) residing therein. The temperature control system (20, 22, 24) comprises (i) a radiant heater assembly (20) for heating the substrate (18), comprising a plurality of radiant heating elements (58) arranged in a plurality of zones (a–n), each zone comprising at least one heating element, and a focused reflector (56) for focusing radiant energy from the heating elements toward the substrate; (ii) a feedback mechanism (24) for providing a substrate temperature feedback signal (25); and (iii) a controller (22), including a P-I-D closed loop controller (80) and a lamp power controller (90). The P-I-D closed loop controller (80) receives a temperature setpoint signal and the temperature feedback signal and in response thereto independently adjusts a control variable sent to the lamp power controller. The power controller (90) then adjusts the power applied to the plurality of zones of radiant heating elements, independently of the control variable, based on temperature zone maps stored in processor memory. The power controller operates in at least a first ramp state and a second steady state, depending upon the magnitude of difference (Δ) between the temperature setpoint signal and the temperature feedback signal.

21 Claims, 5 Drawing Sheets

ZONE CONTROLLED RADIANT HEATING SYSTEM UTILIZING FOCUSED REFLECTOR

FIELD OF THE INVENTION

The present invention relates generally to the field of semiconductor processing systems such as photoresist ashers, and more specifically to a zone controlled radiant heating device utilizing a focused reflector, for use in such systems.

BACKGROUND OF THE INVENTION

In the manufacture of integrated circuits, photolithography techniques are used to form integrated circuit patterns on a substrate. Typically, the substrate is coated with a photoresist, portions of which are exposed to ultraviolet (UV) radiation through a mask to image a desired circuit pattern on the photoresist. The portions of the photoresist left unexposed to the UV radiation are removed by a processing solution, leaving only the exposed portions on the substrate. These remaining exposed portions are baked during a photostabilization process to enable the photoresist to withstand subsequent processing.

After such processing, in which the integrated circuit components are formed, it is generally necessary to remove the baked photoresist from the wafer. In addition, residue that has been introduced on the substrate surface through processes such as etching must be removed. Typically, the photoresist is "ashed" or "burned" and the ashed or burned photoresist, along with the residue, is "stripped" or "cleaned" from the surface of the substrate.

One manner of removing photoresist and residues is by directing a microwave-energized plasma at the substrate surface. In a photoresist ashing process, the substrate is rapidly heated to a preset temperature by infrared radiation. During the ashing process, exothermic reactions on the substrate surface, variations in direction of heat flow, and changing thermal radiation characteristics of the substrate can result in continuous thermal transients and temperature gradients on the substrate surface. Temperature gradients are often most pronounced during the ramping phase wherein the substrate temperature is raised to the desired level, although lesser gradients may remain when the substrate is maintained in the steady state phase at this desired level. Such thermal transients and temperature gradients are undesirable in an ashing process as non-uniform heating of the substrate typically results in non-uniform ashing of the photoresist.

One approach to uniformly heating a substrate is to use a heating configuration utilizing a plurality of heating zones, the output radiation of each of which is directed to a specific zone of the substrate by a reflector. In such a case the shape of the reflector is not critically important because the heating zones are individually controlled, using separate feedback (e.g., an optical pyrometer output signal) from each zone to aid in determining the zone power control signal. However, in addition to the complexity and cost of using a plurality of pyrometers, such a system typically experiences a slower ramp rate than what can be maximally achieved with full power applied to each zone. In addition, such a system is not effective in low temperature processes because optical pyrometers typically do not work well under 200° C.

Thus, it is an object of the present invention to provide a system for providing uniform heating of a substrate utilizing only a single temperature feedback device. It is further object of the present invention to provide such a system that controls temperatures under low temperature (under 200° C.) process conditions. It is still a further object of the present invention to provide such a system wherein the combination of zone control and the shape of the heating reflector is used to achieve a maximum ramp rate, followed by a steady state phase, wherein the point-to-point temperature gradient on a heated substrate is no greater than 2% of the temperature setpoint. Yet further objects of the invention are to reduce the number of heating sources and the peak power requirements of such a system in order to reduce the size of required switchgear, and thus the area required for implementing the system.

SUMMARY OF THE INVENTION

A temperature control system is provided for a plasma processing device. The plasma processing device comprises a plasma generator and a processing chamber in communication with the plasma generator such that plasma within the generator may pass into the chamber and react with the surface of a substrate residing therein. The temperature control system comprises (i) a radiant heater assembly for heating the substrate, comprising a plurality of radiant heating elements arranged in a plurality of zones, each zone comprising at least one heating element, and a focused reflector for focusing radiant energy from the heating elements toward the substrate; (ii) a feedback mechanism for providing a substrate temperature feedback signal; and (iii) a controller, including a P-I-D closed loop controller and a lamp power controller.

The P-I-D controller receives an operator-selected process recipe (e.g., wafer temperature setpoint, chamber wall temperature, gas mixture and mass flow rate), as well as the temperature feedback signal, and adjusts a control variable output to the power controller. The power controller, operating parallel to but independent of the P-I-D controller, also receives the temperature feedback signal and compares it to the temperature setpoint signal. The power controller then adjusts the power applied to the plurality of zones of radiant heating elements.

The power controller operates in at least a first ramp state and a second steady state, depending upon the magnitude of difference ($\Delta$) between the temperature setpoint signal and the temperature feedback signal. The power controller can, independently of the control variable, adjust the power applied to the plurality of zones of radiant heating elements, in response to stored temperature zone maps. Zone maps can be stored in a processor memory in the form of look-up tables for a variety of system operating conditions for both the (i) ramp to setpoint temperature and (ii) steady state conditions.

The zone maps allow the processor to control the output of the power controller, independently of the control variable signal from the P-I-D closed loop controller, by independent phase modulation of each zone in the lamp array. Zone maps for different process recipes allow for adjustment of the irradiance of different portions of the wafer, for example center to edge. The maps also allow the heating system to compensate for chamber geometry and wall temperature radiation cooling effects, in particular those which would cause severe temperature gradients from the center to the edge of the wafer during processing.

The power applied to each zone can be varied by the zone map internally to the power controller according to the equation $P_{actual} = P_{maximum}(d)^{0.77}$ where d equals the percentage of available power applied to each individual zone. The variable d is also stored in the form of a look-up table in the power controller processor memory.

DETAILED DESCRIPTION OF A PREFERRED EMBODIMENT

Figure 1:
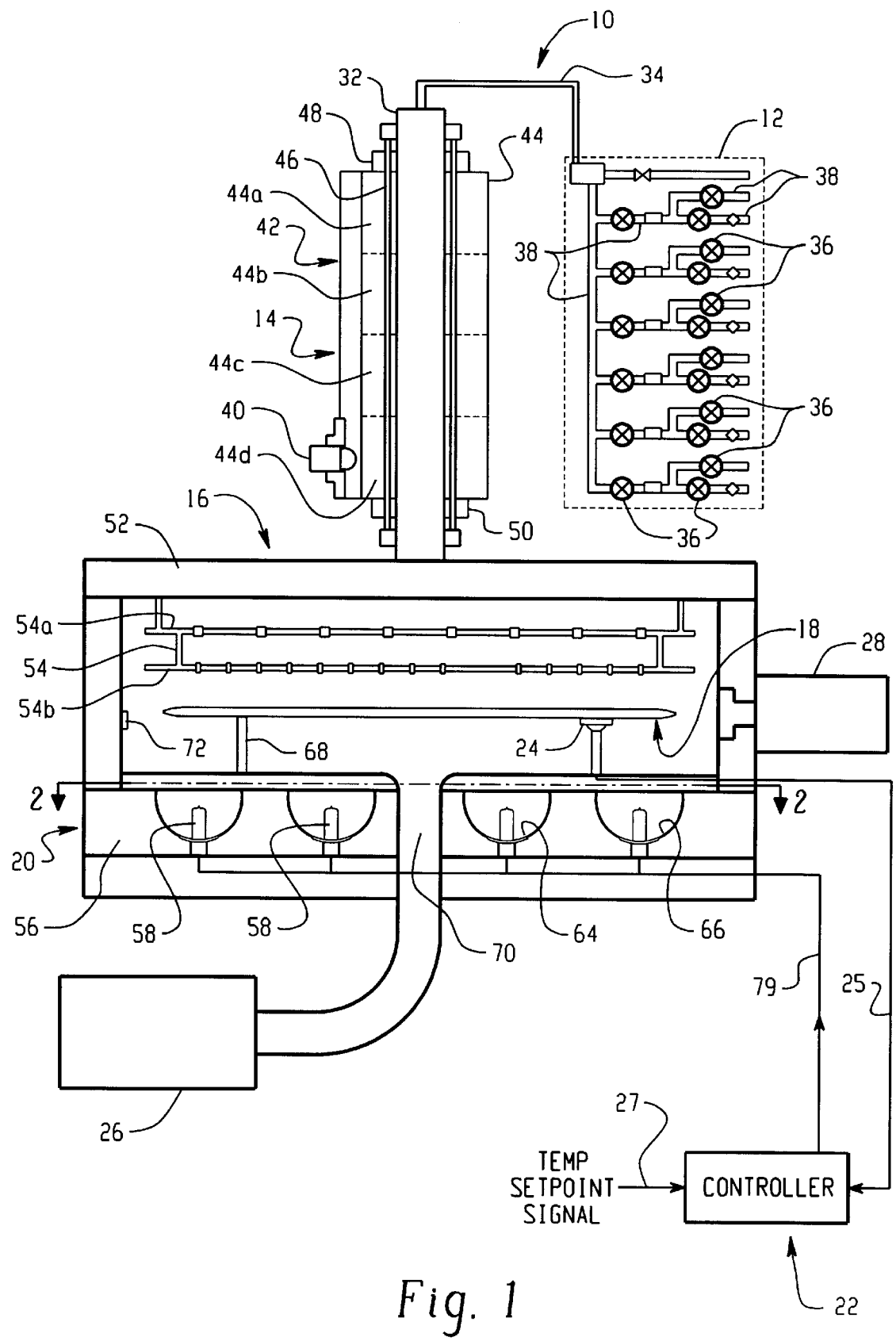
FIG. 1 is a cross sectional view of a photoresist asher into which is incorporated the zone controlled radiant heating system of the present invention.

Referring now to the drawings, FIG. 1 discloses a photoresist asher comprising a gas box 12; a microwave power generator assembly 14; a process chamber 16 in which is heated a semiconductor substrate such as a wafer 18; a radiant heater assembly 20 for heating the wafer 18, situated at the bottom of the process chamber; and a controller 22 for controlling the power to the radiant heater assembly. A temperature probe 24, such as a thermocouple, is used to monitor the temperature of the wafer 18 and provide a signal indicative thereof to the controller 22. A vacuum pump 26 is used to evacuate the process chamber 16 for processes requiring vacuum conditions. A monochromator 28 is used to monitor the optical emission characteristics of gases within the chamber to aid in process endpoint determination.

In operation, a desired mixture of gases is introduced into a sapphire tube 32 from gas box 12 through an inlet conduit 34. The gases forming the desired mixture are stored in separate supplies (not shown) and mixed in the gas box 12 by means of valves 36 and piping 38. One example of a desired gas mixture is forming gas (primarily nitrogen with a small percentage of hydrogen), oxygen and carbon tetrafluoride.

The desired gas mixture is energized by the microwave power generator assembly 14 to form a reactive plasma that will ash photoresist on the wafer 18 in the process chamber 16 when heated by the radiant heater assembly 20. A magnetron 40 generates microwave energy that is coupled to a waveguide 42. Microwave energy is fed from the waveguide through apertures (not shown) in microwave enclosure 44, which surrounds the sapphire tube 32. An outer quartz tube 46 surrounds the sapphire plasma tube 32, slightly separated therefrom. Pressurized air is fed into the gap between the tubes 32 and 46 to effectively cool the sapphire tube 32 during operation.

The microwave enclosure is segmented into four sections 44a, 44b, 44c and 44d. Segmentation of the enclosure 44 prevents an unacceptably large thermal gradient from developing along its axial length when suitable input power is provided. Each segment of the enclosure is separately fed with microwave energy that passes through the quartz tube 46 and the sapphire tube 32 passing therethrough. Gas within the inner sapphire tube 32 is thereby energized to create a plasma. Microwave traps 48 and 50 are provided at the ends of the microwave enclosure 44 to prevent microwave leakage.

The energized plasma enters the process chamber 16 through an opening (not shown) in the top wall 52 thereof. The reactive plasma ashes the photoresist on the wafer 18.

To obtain a uniform ash rate of the photoresist on the wafer, (i) the reactive plasma must be uniformly distributed across the surface of the wafer, (ii) the temperature of the reactive plasma must be maintained so as to minimize the heat energy applied to the wafer by the plasma, and (iii) a uniform temperature must be maintained across the surface of the wafer. An apertured, dual layered baffle plate assembly 54, comprised of upper baffle plate 54a and lower baffle plate 54b, evenly distributes the reactive plasma across the surface of the wafer 18 being processed, and reduces the temperature of the reactive plasma passing through the baffle plate assembly.

The present invention is embodied in the combination of the radiant heater assembly 20 for heating the wafer 18, the controller 22 for controlling the power to the radiant heater assembly (including a P-I-D controller and a lamp controller), and the thermocouple 24 for providing wafer temperature feedback to the PID controller. The thermocouple provides accurate temperature feedback measurements under 200° C. This combination functions to maintain a uniform temperature across the surface of the wafer 18, within 2° C. of the process setpoint temperature. Such temperature uniformity insures consistently uniform photoresist ashing rates.

Figure 2:
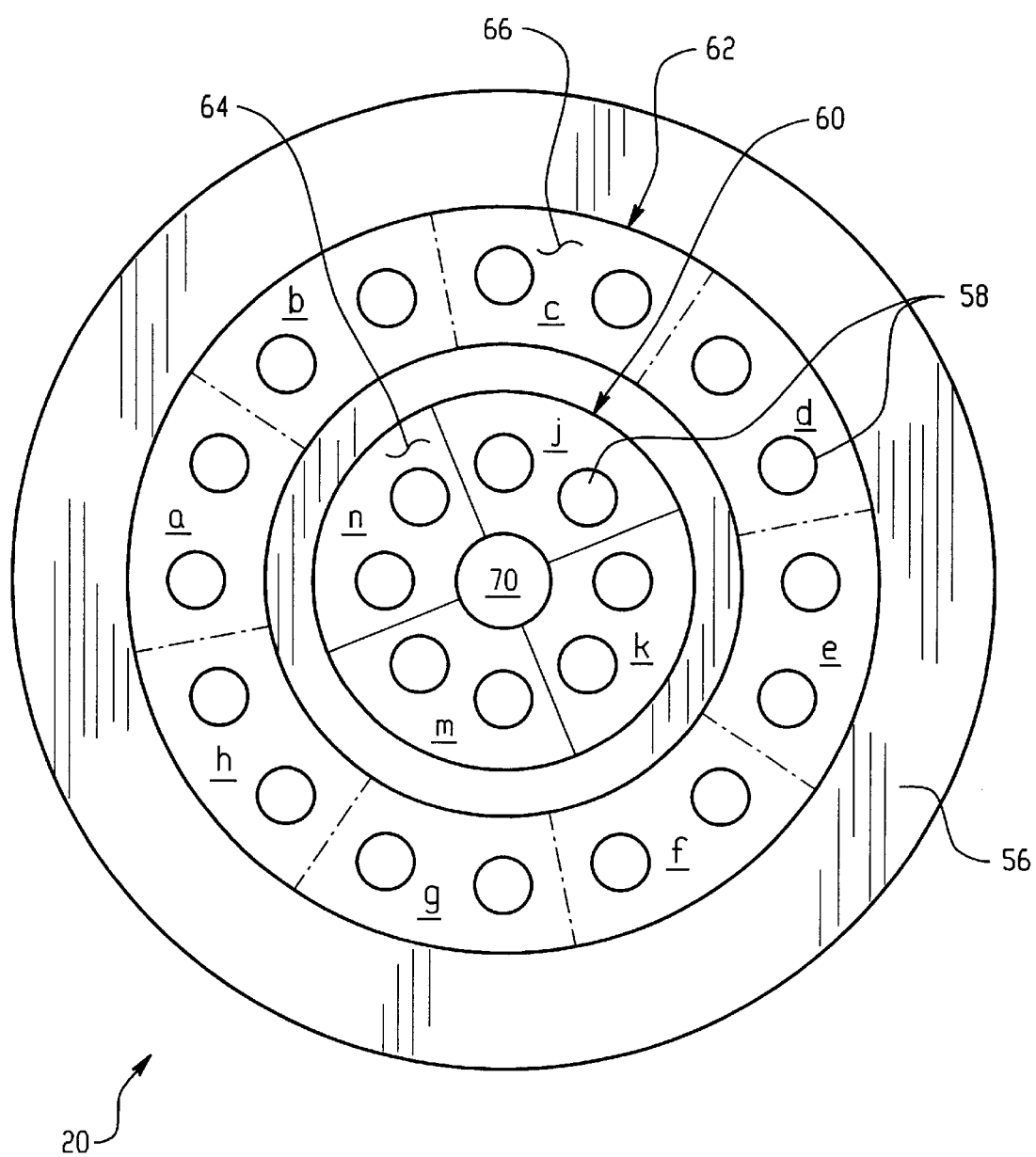
FIG. 2 is a plan view of the radiant heater assembly of the heating system of the asher of FIG. 1, taken along the lines 2—2, showing the zones into which the radiant heater is segmented.

FIG. 2 shows the radiant heater assembly 20 in plan view. The radiant heater assembly 20 comprises a reflector 56 and a plurality of tungsten halogen lamps 58 forming an inner annular array 60 and an outer annular array 62. The arrays may also be referred to as bulb rings or troughs. The lamps 58 in the inner annular array 60 are positioned circumferentially equidistant from each other within the trough of an inner annular reflector 64 having a generally semicircular or parabolic cross section. Similarly, the lamps 58 in the outer annular array 62 are positioned circumferentially equidistant from each other within the trough of an outer annular reflector 66 having a semicircular or parabolic cross section (see FIG. 1).

The parabolic or semicircular (concave) reflector shape reflects and redirects the heat generated by the lamps toward the backside of the wafer 18 positioned within the process chamber 16 on pins 68 (see FIG. 1). The outer edge of the outer annular reflector 66 extends at least as far radially outward as the outer edge of the wafer positioned thereabove to prevent edge cooling effects. No lamp 58 is positioned at a central opening 70 of the reflector 56 because the center of the wafer typically experiences the highest temperature during heating. The central opening 70 in the reflector also provides a path through which the process chamber 16 may be evacuated by vacuum pump 26 (see FIG. 1).

The inner annular lamp array 60 and the outer annular lamp array 62 are segmented into zones (a–n) for control purposes. As shown in FIG. 2, inner array 60 comprises eight lamps segmented into four zones, each comprising two adjacently positioned lamps. Outer array 62 comprises sixteen lamps segmented into eight zones, each comprising two adjacently positioned lamps. As such, twenty-four total lamps 58 are divided into twelve zones (a–n) each comprising to adjacently positioned lamps. The number of zones (a–n), of course, may be lesser or greater than twelve. In FIG. 2, adjacent zones are shown as being segmented by phantom radially extending lines.

Figure 3:
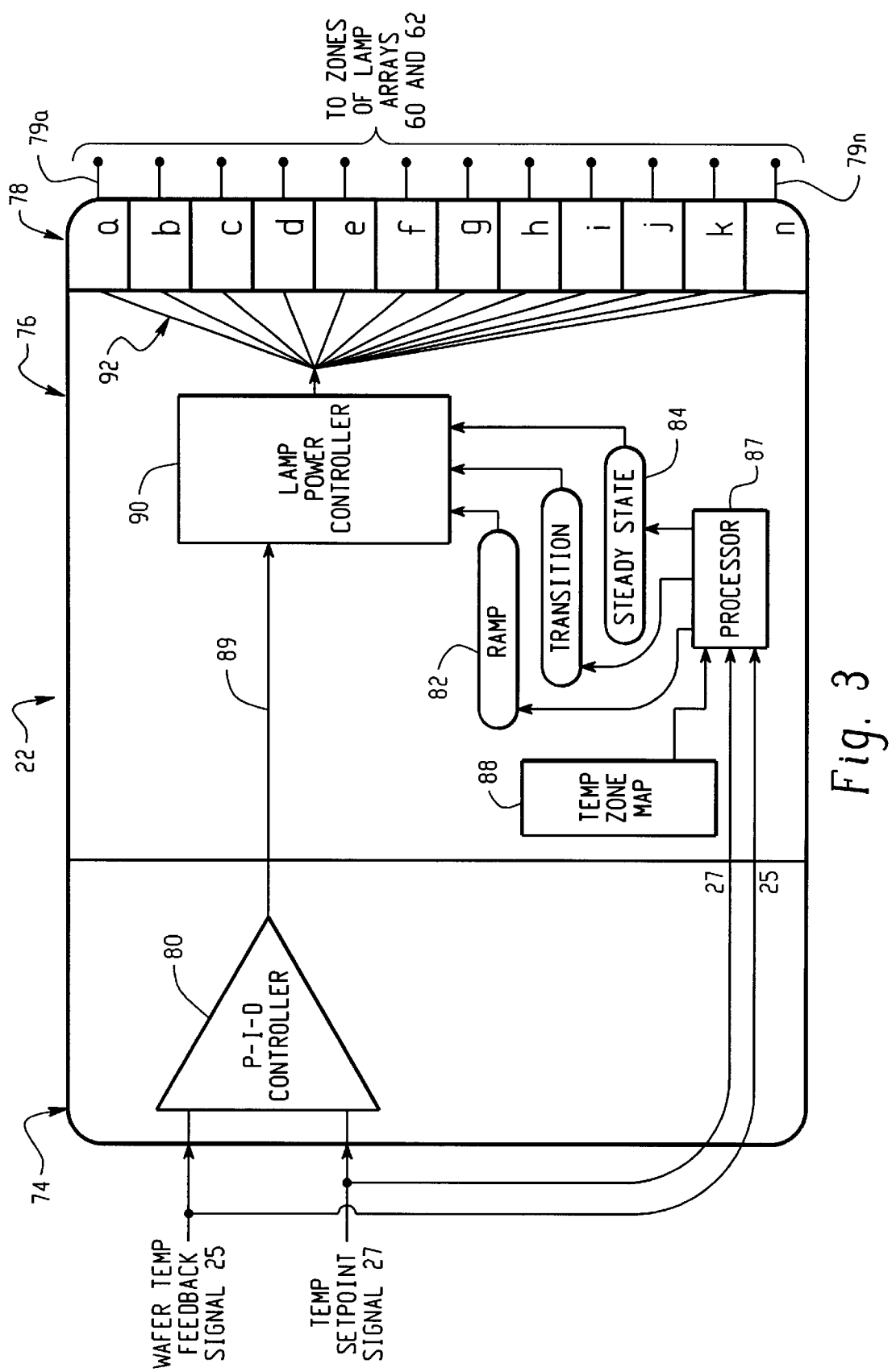
FIG. 3 is a more detailed block diagrammatic view of the controller for the radiant heater assembly shown in FIG. 2.

FIG. 3 is a more detailed block diagrammatic view of the controller 22 for the radiant heater assembly 20 shown in FIG. 2. The controller 22 comprises first level control logic 74, second level control logic 76, and output power supplies 78a–78n, each of which drives one of the twelve zones of lamps 58. The first level control logic 74 is implemented in the disclosed embodiment as a closed loop P-I-D controller 80 that uses as inputs a wafer temperature feedback signal 25 from thermocouple 24, and a temperature setpoint signal 27 (e.g., 80°–300° C.) selected by an operator via a designated process recipe. The P-I-D controller 80 may include a comparator for comparing the signals 25 and 27, and an amplifier for amplifying the error signal represented by the difference between these two signals.

The P-I-D controller 80 compares the wafer temperature feedback and the desired temperature setpoint. Based on the difference between these two signals, the P-I-D controller 80 outputs a variable control signal 89 to phase-modulated lamp power controller 90 within second level control logic 76. In response to the variable control signal 89, the lamp power controller 90 controls via control signals 92 the power supplied to the twelve zones of lamps 58 by output power supplies 78a–78n.

A processor 87 within second level control logic 76 also receives as inputs the wafer temperature feedback signal 25 from thermocouple 24 and the temperature setpoint signal 27. Based on the difference in magnitude of these two signals, the processor determines whether the lamp power controller 90 should be operated in the ramp state 82 (initially), the steady state 84, or a transition state 86 (intermediate the ramp state and the steady state).

The processor uses a look-up table or temperature zone map 88 within its operating software to determine what adjustments the lamp power controller 90 must make to power supplies 78a–78n to accommodate the temperatures required by a particular zone map for a particular state of operation. Typically, the processor 87 will re-set the per-zone power level for each of the twelve zones in the lamp arrays. This action by the processor 87 is independent of the variable control signal 89 received by the lamp power controller 90 from P-I-D controller 80. Temperature setpoint signals, such as setpoint signal 27, and the temperature zone maps 88 are stored in one or more memory devices (not shown).

Figure 4:
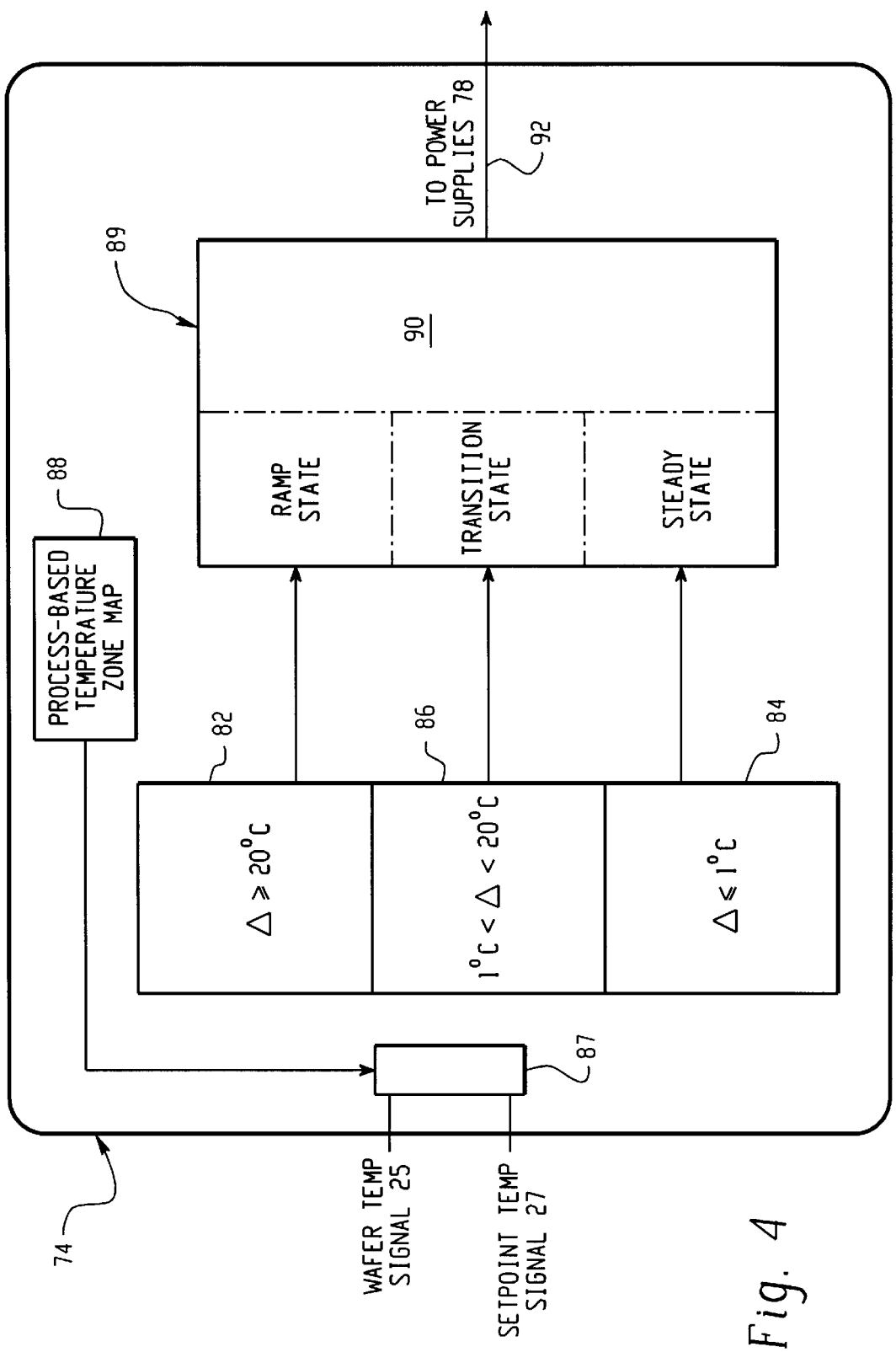
FIG. 4 is a more detailed block diagram of the second level control logic of the controller of FIG. 3.

FIG. 4 shows a more detailed block diagram of second level control logic 76 of the controller 22 of FIG. 3. As shown in FIG. 4, the processor 87 receives as inputs the desired temperature setpoint and the output of the thermocouple 24, which may be in the form of an analog voltage signal representative of their respective measurements. Based on the magnitude of the difference (delta ($\Delta$)) between the desired temperature setpoint 27 and the wafer temperature feedback 25, the processor determines in which state the radiant heater assembly 20 should be operated.

In operation, for example, upon initiation of a particular heating process (e.g., a setpoint of 270° C. at a process chamber wall temperature of 15° C.), it is desired that the setpoint be achieved as soon as possible via an optimum ramp rate without overshooting the setpoint. The initial setpoint/wafer temperature difference is likely to be large (270° C. setpoint temperature vs. 22° C. wafer ambient temperature). As such, the processor 87 initially issues a ramp state 82 signal to the lamp power controller 90 wherein each of the individual zone power supplies 78 are instructed to provide maximum power their respective zones.

As used herein, maximum power may not necessarily be full 100% power, but some lesser number such as 80% power, which will still achieve an acceptable and desired ramp rate. In the present invention, it has been found that 80% power to each of the zones will achieve an acceptable wafer temperature ramp rate of about 22–25° C. per second.

Individual zone control is not required upon initial ramping of the system in ramp state 82, because the reflector design supplies the required uniform irradiance. Thus, in the ramp state 82, the processor 87 provides a control signal to the lamp power controller 90 based only on the ramp state of operation as determined by the processor, and not the zone map 88 (being uniformly set to 80%).

When the wafer temperature feedback nears the desired setpoint, for example within a preset percentage (e.g., 20° C.) of the temperature setpoint, the processor 87 issues a transition state 86 signal to the lamp power controller 90. During this transition state, the processor 87 also looks to the temperature zone map 88 to determine the nature of the control signal to issue to the lamp power controller 90. The lamp power controller adjusts the signals 92 provided to the power supplies 78a–n based on this control signal (and the variable control signal 89 output by the P-I-D controller 80).

The temperature zone map 88 is essentially a look-up table that stores input power requirements for the different wafer zones in lamp arrays 60 and 62, based on empirical process data obtained for different process temperatures and wafer types and sizes. The temperature zone map may also be modified to compensate for geometries in the process chamber 52 design or known heat loss areas within the chamber that may affect wafer heating.

For example, the temperature zone map 88 can identify and distinguish between a first set of zone input power requirements for a 270° C. wafer process temperature carried out in a process chamber 52 having walls maintained at 15° C., and a second set of zone input power requirements for a 100° C. wafer process temperature carried out in a process chamber 52 having walls maintained at 30° C. Any number of process recipes may be stored (mapped) and indirectly accessed by an operator. Based on a process recipe that the operator chooses, operating software selects the particular zone map 88 to be provided to the processor 87.

Based on the transition state status of the process, and on the selected temperature zone map 88 for the desired process recipe, the processor 87 will provide a control signal to the lamp power controller 90. Typically, the control signal will reduce the power supplied to the lamp array so that the rate of wafer heat increase is slowed, as compared to the time-averaged ramp rate, as the wafer temperature approaches its desired setpoint.

When the wafer temperature feedback nears the desired setpoint, for example within 1° C. of the temperature setpoint, the processor 87 issues a steady state 86 signal to the lamp power controller 90. Again, the processor 87 will provide a control signal to the lamp power controller 90 based on the steady state status and the selected temperature zone map 88. Typically (but not always), for a given selected zone map, the control signal in the steady state will instruct the power controller 90 to further reduce the power levels applied to the inner and outer lamp arrays via control signals 92.

However, the power levels for the inner and outer arrays are likely to differ in the steady state. For example, zones in the outer array 62 may be operated at 70% power, while the zones in the inner array 60 may be operated at 50% power to control for heat losses at the wafer edges that are inherent in a cold wall processing system. Of course, not all of the zones in an array must be operated at the same power level. Variations in power levels for different zones within the same array may be necessary to compensate for other factors such as chamber geometries or known areas of heat loss within the chamber, including the process chamber wafer loading slot and door assembly.

During the steady state, wafer temperature feedback is used by the P-I-D controller 80 to adjust the lamp power controller 90 to maintain the wafer temperature at the point of measurement to within 2% of the process temperature setpoint. In addition, the lamp power controller 90 also regulates power internally per the appropriate zone map 88, in this case the steady state. Thus, the actual applied power, per the above example, would be 70% of what the P-I-D controller output signal 89 requested (for the outer array zones) and 50% of what the P-I-D controller output signal 89 requested (for the inner array zones).

One or more temperature sensors 72, such as thermocouples (see FIG. 1), are mounted on the interior of process chamber wall 52 to provide an indication of wall temperature. Such sensors are used in the heating/cooling system for maintaining process wall temperature, but are not used as direct inputs to the zone controlled radiant wafer heating system of the present invention. However, because the temperature zone maps directly influence the wafer heating system of the present invention, and are based in part on process chamber wall temperatures, the temperature sensors and chamber wall heating/cooling systems must work effectively to provide an accurate and reliable wafer heating system.

Figure 5:
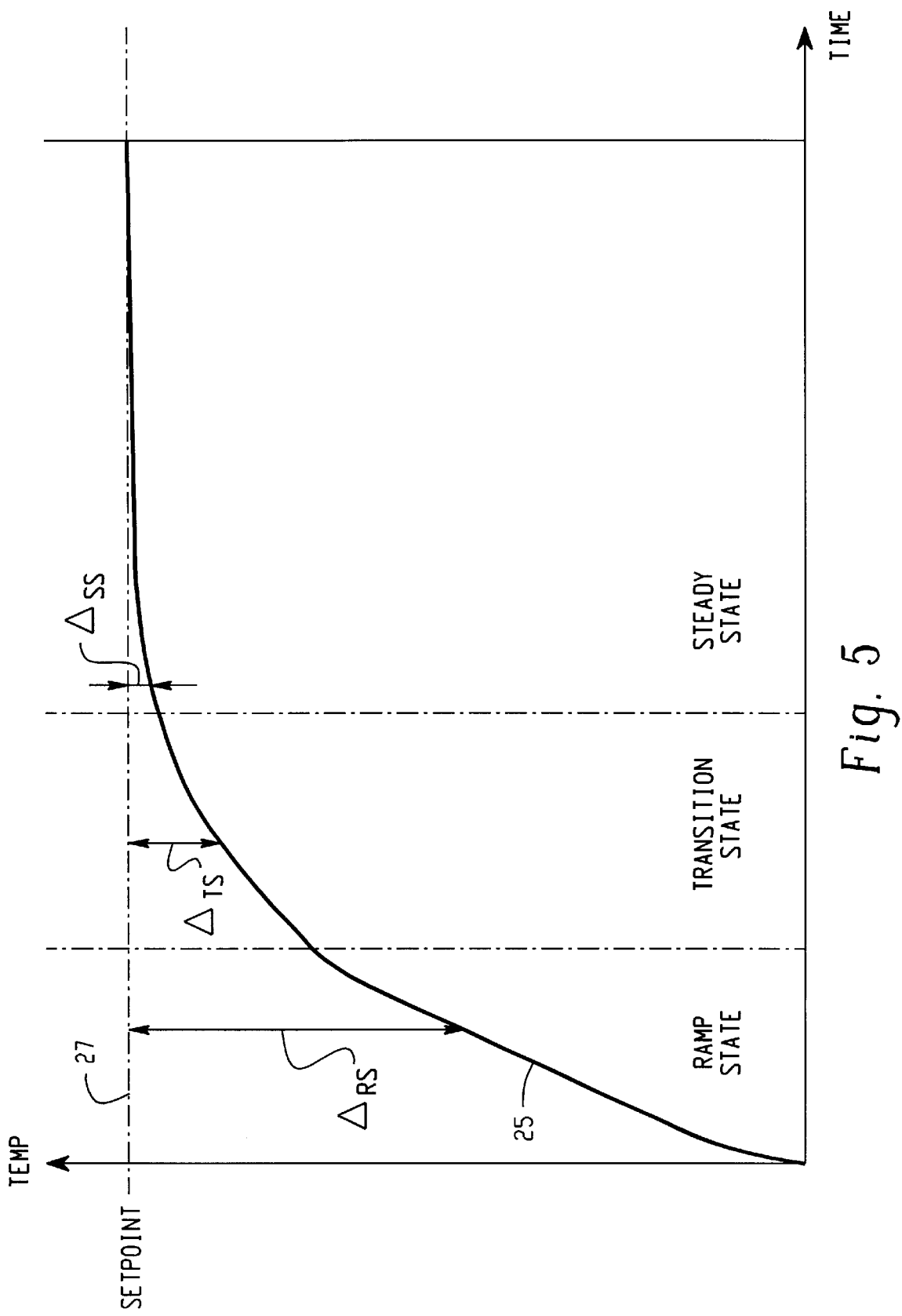
FIG. 5 is a graphical representation of wafer temperature versus time using the photoresist asher of FIG. 1.

FIG. 5 is a graphical representation of wafer temperature versus time. The temperature of the wafer, as provided by feedback thermocouple 24, is shown in the ramp, transition, and steady states of operation. As shown, the difference (delta ($\Delta$)) between the desired temperature setpoint 27 and the wafer temperature feedback 25, is shown for each state ($\Delta_{RS}$, $\Delta_{TS}$, and $\Delta_{SS}$, respectively). As can be seen, the present invention provides for a close approximation of temperature to the desired setpoint without any overshoot. If a minimal amount of temperature overshoot is acceptable, the intermediate transition phase of operation may be eliminated in favor of a two phase (ramp and steady state) operation, such that the temperature setpoint may be more quickly achieved.

Accordingly, a preferred embodiment of a method and system for providing a zone controlled radiant heating system has been described. Using the present invention, the point-to-point temperature gradient on a heated substrate has been found to be no greater than 2% of the temperature setpoint. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. A plasma processing device (10) comprising:
   (i) a plasma generator (14);
   (ii) a processing chamber (16) in communication with said plasma generator (14) such that plasma within said generator may pass into said chamber and react with the surface of a substrate (18) residing therein;
   (iii) a radiant heater assembly (20) for heating the substrate (18), comprising a plurality of radiant heating elements (58) arranged in a plurality of zones (a–n), each zone comprising at least one heating element, and a focused reflector (56) for focusing radiant energy from the heating elements toward the substrate;
   (iv) a feedback mechanism (24) for providing a substrate temperature feedback signal (25);
   (v) a controller (22) for receiving a temperature setpoint signal (27) and the temperature feedback signal (25) and in response thereto independently controlling power applied to the plurality of zones of radiant heating elements, wherein said controller (22) operates in at least a first ramp state (82) and a second steady state (84), depending upon the magnitude of difference ($\Delta$) between said temperature setpoint signal (27) and said temperature feedback signal (25); and
   (vi) a power controller (90) for independently controlling power applied to the plurality of zones (a–n) of radiant heating elements in at least said steady state (84) based on stored temperature zone maps (88).

2. The plasma processing device (10) of claim 1, wherein said controller (22) additionally operates in a transition state (86) intermediate said first ramp state (82) and said second steady state (84), depending upon the magnitude of difference ($\Delta$) between said temperature setpoint signal (27) and said temperature feedback signal (25).

3. The plasma processing device (10) of claim 1, wherein a processor (87) determines the magnitude of difference ($\Delta$) between said temperature setpoint signal (27) and said temperature feedback signal (25), and wherein said processor (87) reads said zone maps (88) and outputs a control signal to said power controller (90).

4. The plasma processing device (10) of claim 1, wherein said feedback mechanism (24) comprises a single thermocouple.

5. The plasma processing device (10) of claim 1, wherein said controller (22) controls temperatures for process conditions under 200° C. and controls a point-to-point temperature gradient on the substrate (18) to within 2% of the temperature setpoint signal (27).

6. The plasma processing device (10) of claim 1, wherein said radiant heating elements (58) are arranged in at least two concentric generally circular arrays (60, 62) having a generally semicircular or parabolic cross section.

7. The plasma processing device (10) of claim 1, wherein said processing device is a photoresist asher.

8. The plasma processing device (10) of claim 1, wherein a vacuum pump (26) is provided for evacuating said process chamber (16) for processes requiring vacuum conditions, and wherein means (72) are provided for controlling the temperature of walls (52) of said process chamber.

9. A temperature control system (20, 22, 24) for a plasma processing device (10) comprising a plasma generator (14) and a processing chamber (16) in communication with the plasma generator such that plasma within the generator may pass into the chamber and react with the surface of a substrate (18) residing therein, said temperature control system (20, 22, 24) comprising:
   (i) a radiant heater assembly (20) for heating the substrate (18), comprising a plurality of radiant heating elements (58) arranged in a plurality of zones (a–n), each zone comprising at least one heating element, and a focused reflector (56) for focusing radiant energy from the heating elements toward the substrate;
   (ii) a feedback mechanism (24) for providing a substrate temperature feedback signal (25);
   (iii) a controller (22) for receiving a temperature setpoint signal (27) and the temperature feedback signal (25) and in response thereto independently controlling power applied to the plurality of zones of radiant heating elements, wherein said controller (22) operates in at least a first ramp state (82) and a second steady state (84), depending upon the magnitude of difference ($\Delta$) between said temperature setpoint signal (27) and said temperature feedback signal (25); and
   (iv) a power controller (90) for independently controlling power applied to the plurality of zones (a–n) of radiant heating elements in at least said steady state (84) based on stored temperature zone maps (88).

10. The temperature control system (20, 22, 24) of claim 11, wherein said controller (22) additionally operates in a transition state (86) intermediate said first ramp state (82) and said second steady state (84), depending upon the magnitude of difference (Δ) between said temperature setpoint signal (27) and said temperature feedback signal (25).

11. The temperature control system (20, 22, 24) of claim 9, wherein a processor (87) determines the magnitude of difference (Δ) between said temperature setpoint signal (27) and said temperature feedback signal (25), and wherein said processor (87) reads said zone maps (88) and outputs a control signal to said power controller (90).

12. The temperature control system (20, 22, 24) of claim 9, wherein said feedback mechanism (24) comprises a single thermocouple.

13. The temperature control system (20, 22, 24) of claim 9, wherein said controller (22) controls temperatures for process conditions under 200° C. and controls a point-to-point temperature gradient on the substrate (18) to within 2% of the temperature setpoint signal (27).

14. The temperature control system (20, 22, 24) of claim 9, wherein said radiant heating elements (58) are arranged in at least two concentric generally circular arrays (60, 62) having a generally semicircular or parabolic cross section.

15. A method of controlling a temperature of a substrate (18) in a processing device (10) including a plasma generator (14) and a processing chamber (16) in communication with the plasma generator (14) such that plasma within the generator may pass into the chamber and react with the surface of the substrate residing therein, said method comprising the steps of:
  (i) heating the substrate (18) using (a) a radiant heater assembly (20) comprising a plurality of radiant heating elements (58) arranged in a plurality of zones (a–n), each zone comprising at least one heating element, and (b) a focused reflector (56) for focusing radiant energy from the heating elements toward the substrate;
  (ii) providing a substrate temperature feedback signal (25) using a feedback mechanism (24);
  (iii) independently controlling power applied to the plurality of zones of radiant heating elements, using a controller (22) for receiving said temperature feedback signal (25) and a temperature setpoint signal (27) and for outputting to said zones a corresponding number of power level control signals (79a–n), wherein said controller (22) operates in at least a first ramp state (82) and a second steady state (84), depending upon the magnitude of difference (Δ) between said temperature setpoint signal (27) and said temperature feedback signal (25); and
  (iv) using a power controller(90) to independently control power applied to the plurality of zones (a–n) of radiant heating elements in at least said steady state (84) based on stored temperature zone maps (88).

16. The method of claim 15, wherein said controller (22) additionally operates in a transition state (86) intermediate said first ramp state (82) and said second steady state (84), depending upon the magnitude of difference (Δ) between said temperature setpoint signal (27) and said temperature feedback signal (25).

17. The method of claim 15, wherein said controller (22) uses a processor (87) to determine the magnitude of difference (Δ) between said temperature setpoint signal (27) and said temperature feedback signal (25), and wherein said processor (87) reads said zone maps (88) and outputs a control signal to said power controller (90).

18. The method of claim 15, wherein said feedback mechanism (24) comprises a single thermocouple.

19. The method of claim 15, wherein said controller (22) controls temperatures for process conditions under 200° C. and controls a point-to-point temperature gradient on the substrate (18) to within 2% of the temperature setpoint signal (27).

20. The method of claim 15, wherein said radiant heating elements (58) are arranged in at least two concentric generally circular arrays (60, 62) having a generally semicircular or parabolic cross section.

21. The method of claim 15, further comprising the step of controlling the temperature of walls (52) of said process chamber (16).

* * * * *